(12) United States Patent
Takada

(10) Patent No.: US 12,278,604 B2
(45) Date of Patent: Apr. 15, 2025

(54) VOLTAGE FOLLOWER CIRCUIT

(71) Applicant: ABLIC Inc., Nagano (JP)

(72) Inventor: Kosuke Takada, Nagano (JP)

(73) Assignee: ABLIC Inc., Nagano (JP)

( * ) Notice: Subject to any disclaimer, the term of this patent is extended or adjusted under 35 U.S.C. 154(b) by 98 days.

(21) Appl. No.: 18/465,169

(22) Filed: Sep. 12, 2023

(65) Prior Publication Data

US 2024/0146299 A1 May 2, 2024

(30) Foreign Application Priority Data

Oct. 27, 2022 (JP) ................. 2022-172250

(51) Int. Cl.
*H03F 3/50* (2006.01)
*H03F 3/30* (2006.01)
*H03F 3/347* (2006.01)

(52) U.S. Cl.
CPC ........... *H03F 3/505* (2013.01); *H03F 3/3011* (2013.01); *H03F 3/347* (2013.01); *H03F 2203/5027* (2013.01)

(58) Field of Classification Search
CPC ......... H03F 3/3011; H03F 3/347; H03F 3/505
See application file for complete search history.

(56) References Cited

U.S. PATENT DOCUMENTS

| 4,068,140 A * | 1/1978 | Lou ................. H03K 5/023 |
| | | 330/288 |
| 5,825,249 A * | 10/1998 | Nakano .............. H03F 3/345 |
| | | 330/277 |
| 6,137,360 A | 10/2000 | Memida |
| 7,902,882 B2 * | 3/2011 | Vimercati .......... H03K 19/0005 |
| | | 327/108 |
| 2015/0077188 A1* | 3/2015 | Zhan ................. H03F 3/505 |
| | | 330/307 |

FOREIGN PATENT DOCUMENTS

| JP | H10190377 | | 7/1998 |
| JP | 11234567 A | * | 8/1999 |

* cited by examiner

*Primary Examiner* — Patrick O Neill
(74) *Attorney, Agent, or Firm* — JCIPRNET

(57) ABSTRACT

A voltage follower circuit includes a first MOS transistor which has a source connected to an input port, a second MOS transistor which has a source connected to an output port and has a gate and a drain connected to a gate of the first MOS transistor, a first constant current source connected between a drain of the first MOS transistor and a second power supply terminal, a second constant current source connected between the drain of the second MOS transistor and the second power supply terminal, and a depletion type third MOS transistor which has a gate connected to the drain of the first MOS transistor, has a drain connected to a first power supply terminal, and has a source connected to the output port.

6 Claims, 3 Drawing Sheets

VOLTAGE FOLLOWER CIRCUIT

CROSS-REFERENCE TO RELATED APPLICATION

This application claims the priority benefits of Japanese application no. 2022-172250, filed on Oct. 27, 2022. The entirety of the above-mentioned patent application is hereby incorporated by reference herein and made a part of this specification.

BACKGROUND

Technical Field

The present invention relates to a voltage follower circuit.

Description of Related Art

Generally, a buffer circuit or a voltage follower circuit is used when driving a low impedance load. As an example, there is a voltage follower circuit composed of an operational amplifier and an output buffer (see Patent Literature 1 (Japanese Patent Application Laid-open No. H10-190377 (FIG. 13)), for example).

However, since the conventional voltage follower circuit is composed of an operational amplifier and an output buffer, there is room for improvement in that the circuit scale is large and the number of elements is large.

The present invention is intended to provide a voltage follower circuit which has a small circuit scale and a small number of elements.

SUMMARY

An aspect of the present invention provides a voltage follower circuit which includes a first power supply terminal, a second power supply terminal, an input port, an output port, a first MOS transistor which has a source connected to the input port, a second MOS transistor which has a source connected to the output port and has a gate and a drain connected to a gate of the first MOS transistor, a first constant current source connected between a drain of the first MOS transistor and the second power supply terminal, a second constant current source connected between the drain of the second MOS transistor and the second power supply terminal, and a depletion type third MOS transistor which has a gate connected to the drain of the first MOS transistor, has a drain connected to the first power supply terminal, and has a source connected to the output port.

The present invention provides a voltage follower circuit which has a small circuit scale and a small number of elements.

DESCRIPTION OF THE EMBODIMENTS

A voltage follower circuit according to an embodiment of the present invention will be described below with reference to the drawings.

First Configuration Example of the Embodiment

Figure 1:
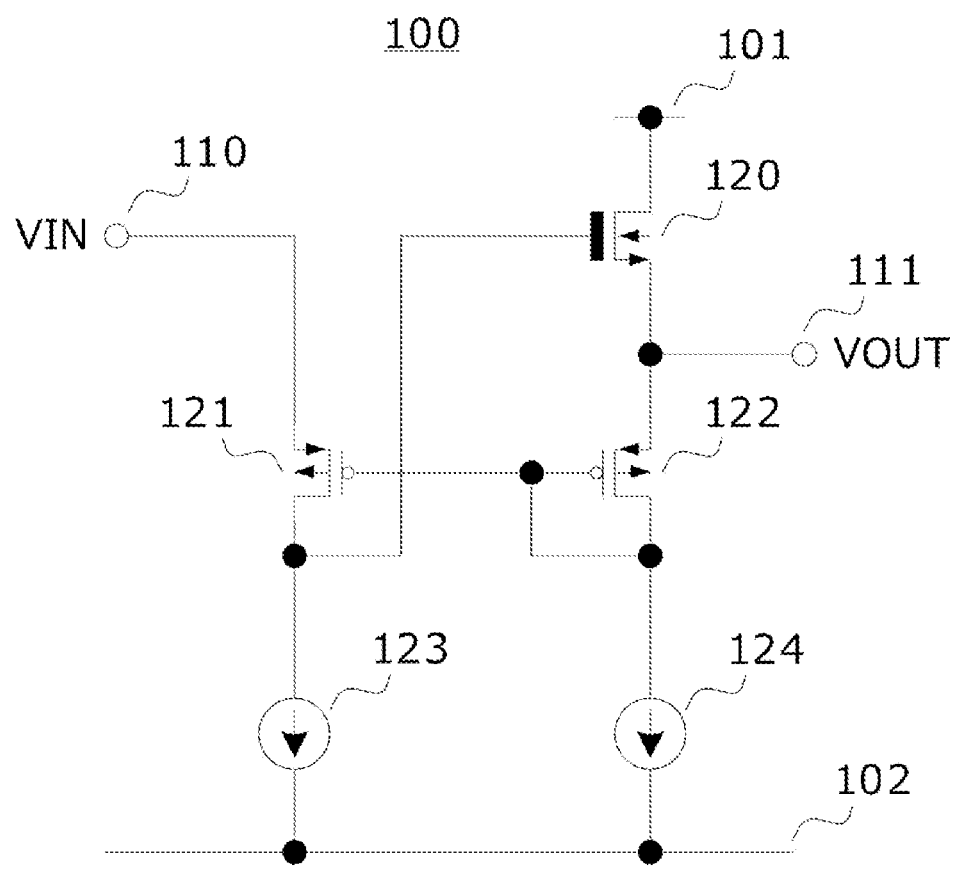
FIG. 1 is a circuit diagram illustrating a first configuration example of a voltage follower circuit according to the embodiment.

FIG. 1 is a circuit diagram of a voltage follower circuit 100, which is a first configuration example of the voltage follower circuit according to the embodiment.

The voltage follower circuit 100 includes a power supply terminal 101 as a first power supply terminal, a ground terminal 102 as a second power supply terminal, an input port 110, an output port 111, a depletion type NMOS transistor 120, PMOS transistors 121 and 122, and a pair of constant current sources 123 and 124 which have the same current value. VIN indicates the voltage of the input port 110. VOUT indicates the voltage of the output port 111.

The NMOS transistor 120 has a drain connected to the power supply terminal 101 and has a source connected to the output port 111 and a source of the PMOS transistor 122. The PMOS transistor 121 has a source connected to the input port 110, has a gate connected to a gate and a drain of the PMOS transistor 122, and has a drain connected to a gate of the NMOS transistor 120.

The source of the PMOS transistor 122 is connected to the output port 111 and the source of the NMOS transistor 120, and the gate and the drain of the PMOS transistor 122 are connected to the gate of the PMOS transistor 121.

The constant current source 123 is connected between the drain of the PMOS transistor 121 and the ground terminal 102.

The constant current source 124 is connected between the drain of the PMOS transistor 122 and the ground terminal 102.

Next, operation of the voltage follower circuit 100 will be described. The constant current sources 123 and 124 supply equal constant currents to the PMOS transistors 121 and 122, respectively. The PMOS transistors 121 and 122 have the same gate voltage, and the source of each of the PMOS transistors 121 and 122 operates as the input of a comparison circuit. The NMOS transistor 120, which receives at the gate thereof the voltage output from the drain of the PMOS transistor 121 as the output of the comparison circuit, functions as a source follower and outputs VOUT from the output port 111.

For example, in the case of VIN>VOUT, the PMOS transistor 121 has a larger absolute value of the voltage between the gate and source among the PMOS transistors 121 and 122, and the drain voltage of the PMOS transistor 121 rises. At this time, the gate voltage of the NMOS transistor 120 rises and VOUT also rises. As a result, operation is performed so that VIN and VOUT are equal.

Thus, the negative feedback loop functions, and the voltage follower circuit 100 operates so that the voltages of the input port 110 and the output port 111 are equal.

In order to operate the PMOS transistor 121 in the saturation region, the drain voltage of the PMOS transistor 121 is, for example, lower than the source voltage. To achieve this, the gate voltage of the NMOS transistor 120 is, for example, lower than VOUT. That is, the NMOS transistor 120 may be of a depletion type.

As described above, according to the voltage follower circuit 100 of the configuration example, the voltage follower circuit 100 includes three MOS transistors and two constant current sources, thereby achieving a voltage follower circuit with a small circuit scale and a small number of elements.

Second Configuration Example of the Embodiment

Figure 2:
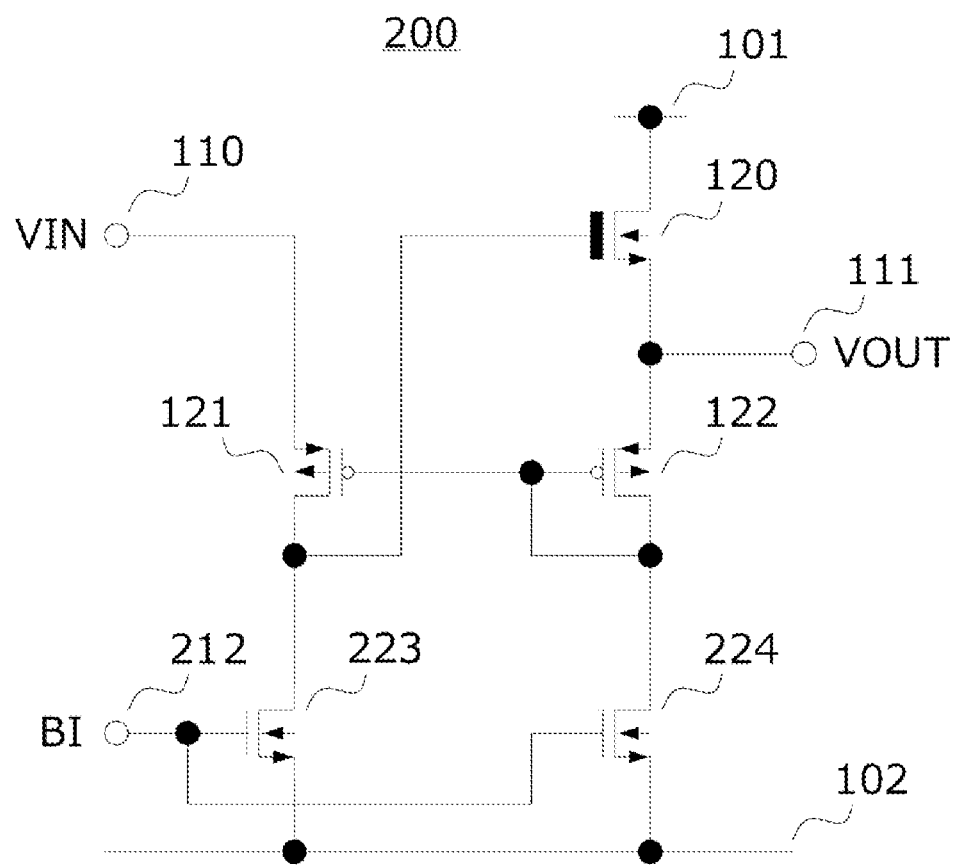
FIG. 2 is a circuit diagram illustrating a second configuration example of a voltage follower circuit according to the embodiment.

FIG. 2 is a circuit diagram of a voltage follower circuit 200, which is a second configuration example of the voltage follower circuit according to the embodiment.

The voltage follower circuit 200 differs from the voltage follower circuit 100 in that NMOS transistors 223 and 224 are provided in place of the constant current sources 123 and 124, but the other points are substantially the same. Thus, in the configuration example, the NMOS transistors 223 and 224 will be mainly described, and components which are substantially the same as the components of the voltage follower circuit 100 will be denoted by the same reference numerals and the description will be omitted.

Each of sources of the NMOS transistors 223 and 224 is connected to the ground terminal 102, drains of the NMOS transistors 223 and 224 are respectively connected to the drains of the PMOS transistors 121 and 122, and each of gates of the NMOS transistors 223 and 224 is connected to an application terminal 212.

Next, operation of the voltage follower circuit 200 will be described.

By applying a constant voltage BI from an external constant voltage source to each of the gates of the NMOS transistors 223 and 224 via the application terminal 212, the NMOS transistors 223 and 224 operate as constant current sources and supply constant currents to the drains of the PMOS transistors 121 and 122, respectively.

Since other operations are substantially the same as the operations of the voltage follower circuit 100, the description will be omitted.

As described above, according to the voltage follower circuit 200 of the configuration example, the voltage follower circuit 200 includes five MOS transistors, thereby achieving a voltage follower circuit with a small circuit scale and a small number of elements.

Third Configuration Example of the Embodiment

Figure 3:
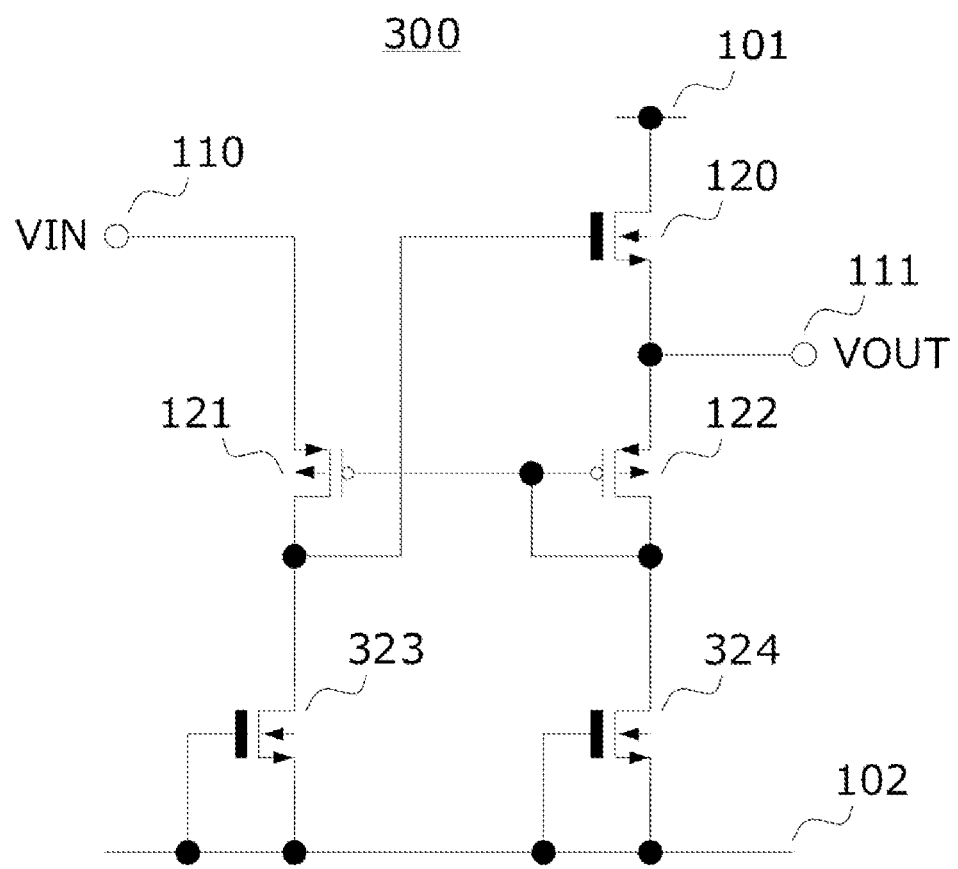
FIG. 3 is a circuit diagram illustrating a third configuration example of a voltage follower circuit according to the embodiment.

FIG. 3 is a circuit diagram of a voltage follower circuit 300, which is a third configuration example of the voltage follower circuit according to the embodiment.

The voltage follower circuit 300 differs from the voltage follower circuit 200 in that depletion type NMOS transistors 323 and 324 are provided in place of the NMOS transistors 223 and 224, but the other points are substantially the same.

The depletion type NMOS transistors 323 and 324 operate as constant current sources simply by connecting respective gates to respective sources, thereby eliminating the need for the application terminal 212 in the voltage follower circuit 200 and the constant voltage source for generating the constant voltage BI.

Since other operations are substantially the same as the operations of the voltage follower circuit 200, the description will be omitted.

As described above, according to the voltage follower circuit 300 of the configuration example, the voltage follower circuit 200 includes five MOS transistors, thereby achieving a voltage follower circuit with a small circuit scale and a small number of elements.

In addition, the present invention is not limited to the above-described embodiment, and in the implementation stage, the present invention may be implemented in various forms other than the above-described embodiment, and various omissions, additions, replacements, or modifications may be made without departing from the spirit of the present invention. For example, in the embodiment described above, the NMOS transistor may be replaced with a PMOS transistor, the PMOS transistor may be replaced with a NMOS transistor, the positive voltage used at the power supply terminal, the input port, etc. may be replaced with a negative voltage, and the direction of the constant current supplied from the constant current source may be reversed.

Such embodiments and modifications thereof are included in the scope and spirit of the present invention, and are also included in the invention described in the claims and equivalents thereof.

What is claimed is:

1. A voltage follower circuit, comprising:
   a first power supply terminal;
   a second power supply terminal;
   an input port;
   an output port;
   a first MOS transistor, having a source connected to the input port;
   a second MOS transistor, having a source connected to the output port and having a gate and a drain connected to a gate of the first MOS transistor;
   a first constant current source, connected between a drain of the first MOS transistor and the second power supply terminal;
   a second constant current source, connected between the drain of the second MOS transistor and the second power supply terminal; and
   a depletion type third MOS transistor, having a gate connected to the drain of the first MOS transistor, having a drain connected to the first power supply terminal, and having a source connected to the output port.

2. The voltage follower circuit according to claim 1, wherein the depletion type third MOS transistor functions as a source follower.

3. The voltage follower circuit according to claim 1, wherein the first constant current source and the second constant current source are a fourth MOS transistor and a fifth MOS transistor having gates to which a constant voltage is applied.

4. The voltage follower circuit according to claim 2, wherein the first constant current source and the second constant current source are a fourth MOS transistor and a fifth MOS transistor having gates to which a constant voltage is applied.

5. The voltage follower circuit according to claim 1, wherein the first constant current source and the second constant current source are a depletion type sixth MOS transistor and a depletion type seventh MOS transistor having respective gates and sources connected to each other.

6. The voltage follower circuit according to claim 2, wherein the first constant current source and the second constant current source are a depletion type sixth MOS transistor and a depletion type seventh MOS transistor having respective gates and sources connected to each other.

* * * * *